(12) United States Patent
Wenger et al.

(10) Patent No.: US 11,165,847 B2
(45) Date of Patent: Nov. 2, 2021

(54) TECHNIQUES FOR MULTIPLE CONFORMANCE POINTS IN MEDIA CODING

(71) Applicant: TENCENT AMERICA LLC, Palo Alto, CA (US)

(72) Inventors: Stephan Wenger, Hillsborough, CA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 0 days.

(21) Appl. No.: 16/504,443

(22) Filed: Jul. 8, 2019

(65) Prior Publication Data

US 2020/0128062 A1     Apr. 23, 2020

Related U.S. Application Data

(60) Provisional application No. 62/749,283, filed on Oct. 23, 2018.

(51) Int. Cl.
| | |
|---|---|
| *H04L 29/06* | (2006.01) |
| *H04N 19/70* | (2014.01) |
| *H04N 19/184* | (2014.01) |
| *H04L 29/08* | (2006.01) |
| *H04N 19/162* | (2014.01) |
| *H04N 19/44* | (2014.01) |
| *H04N 19/91* | (2014.01) |
| *H04N 19/132* | (2014.01) |

(52) U.S. Cl.
CPC ............ *H04L 65/80* (2013.01); *H04L 65/607* (2013.01); *H04L 67/303* (2013.01); *H04N 19/162* (2014.11); *H04N 19/184* (2014.11); *H04N 19/44* (2014.11); *H04N 19/70* (2014.11); *H04N 19/91* (2014.11); *H04N 19/132* (2014.11)

(58) Field of Classification Search
CPC ..... H04L 65/80; H04L 65/607; H04L 67/303; H04N 19/70; H04N 19/184; H04N 19/162; H04N 19/44; H04N 19/91; H04N 19/132
See application file for complete search history.

(56) References Cited

U.S. PATENT DOCUMENTS

| | | | | |
|---|---|---|---|---|
| 5,719,632 A | * | 2/1998 | Hoang | H04N 21/23406 375/240.05 |
| 8,019,169 B2 | * | 9/2011 | Kondo | H04N 19/162 382/236 |

(Continued)

OTHER PUBLICATIONS

International Search Report dated Dec. 5, 2019 issued by the International Searching Authority in International Application No. PCT/US2019/056459.

(Continued)

*Primary Examiner* — Shawn S An
(74) *Attorney, Agent, or Firm* — Sughrue Mion, PLLC

(57) ABSTRACT

A method and apparatus for media decoding by a decoder include decoding a first indication indicative of a first conformance point of a coded video sequence. A second indication indicative of a second conformance point of the coded video sequence is decoded. It is determined whether the coded video sequence is decodable by the decoder based on at least one of the first indication and the second indication. The coded video sequence is selectively decoded based on determining whether the decoded video sequence is decodable by the decoder.

8 Claims, 8 Drawing Sheets

(56) References Cited

U.S. PATENT DOCUMENTS

| | | | |
|---|---|---|---|
| 10,595,048 B1* | 3/2020 | Wenger | H04N 19/127 |
| 2003/0156640 A1* | 8/2003 | Sullivan | H04N 21/8455 |
| | | | 375/240.01 |
| 2007/0189732 A1* | 8/2007 | Pothana | H04N 19/174 |
| | | | 386/329 |
| 2010/0157025 A1* | 6/2010 | Suh | H04N 19/597 |
| | | | 348/51 |
| 2011/0173434 A1* | 7/2011 | Buckley | H04L 65/1006 |
| | | | 713/150 |
| 2012/0183076 A1* | 7/2012 | Boyce | H04N 19/187 |
| | | | 375/240.25 |
| 2013/0266077 A1* | 10/2013 | Boyce | H04N 19/463 |
| | | | 375/240.25 |
| 2015/0222517 A1* | 8/2015 | McLaughlin | H04W 12/50 |
| | | | 713/156 |
| 2016/0227214 A1* | 8/2016 | Rapaka | H04N 19/593 |
| 2016/0366419 A1* | 12/2016 | Suzuki | H04N 21/2401 |
| 2017/0295382 A1* | 10/2017 | Su | H04N 19/31 |

OTHER PUBLICATIONS

Written Opinion dated Decembers, 2019 issued by the International Searching Authority in International Application No. PCT/US2019/056459.

* cited by examiner

FIG. 4   Decoder 310
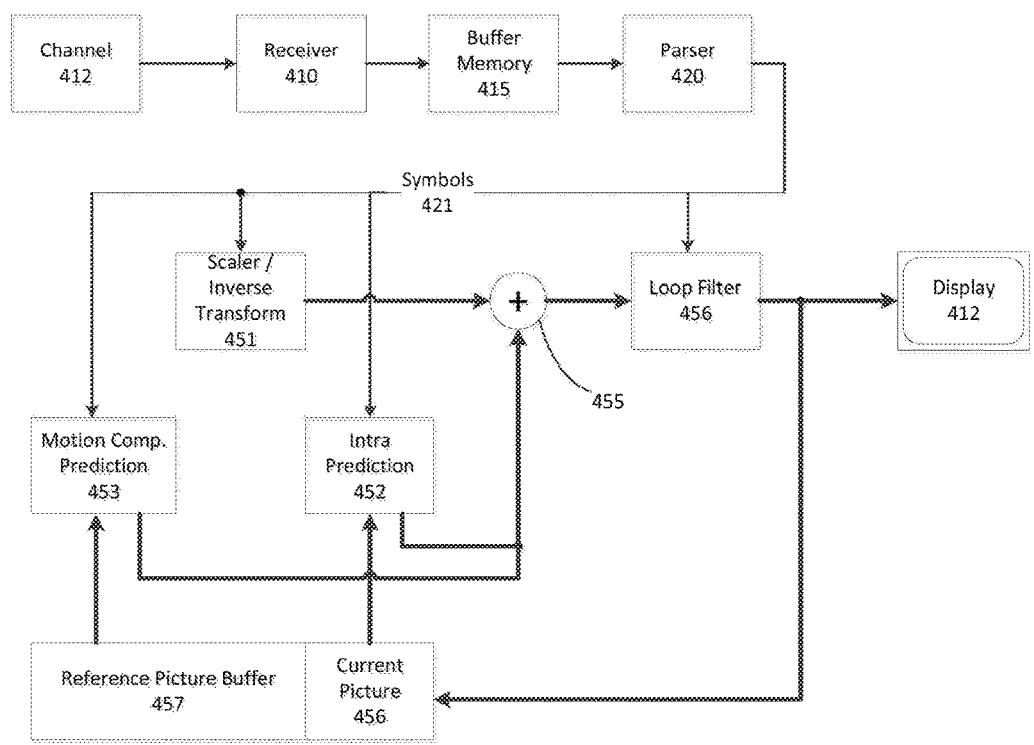

FIG. 5　　Encoder 303
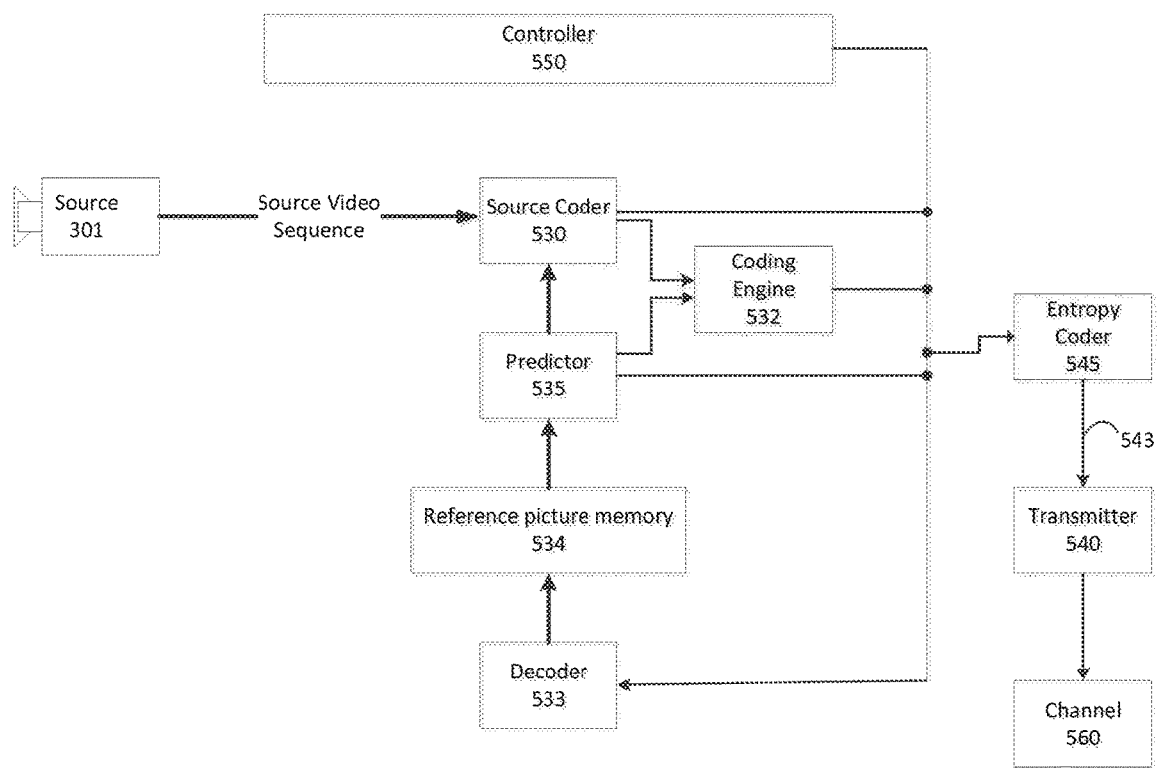

FIG. 6  Syntax Diagram of Multiple Conformance Point Table 601

| | |
|---|---|
| num_sub_profiles | ue(v) |
| for ( i=0; i < num_sub_profiles; i++ ) { | |
|    sub_profile_t35_string [i] | b(32) |
| } | |

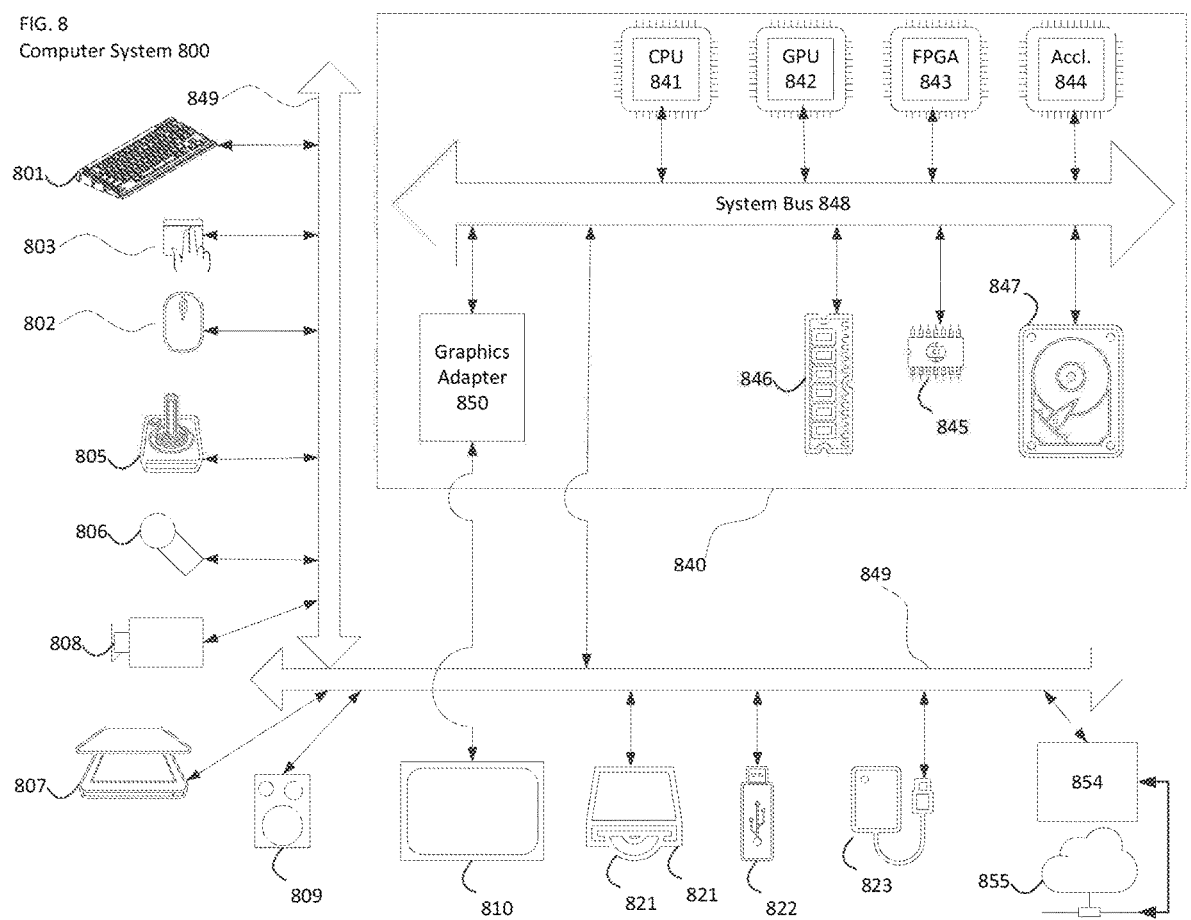

TECHNIQUES FOR MULTIPLE CONFORMANCE POINTS IN MEDIA CODING

CROSS-REFERENCE TO RELATED APPLICATION

This application claims priority under 35 U.S.C. § 119 to U.S. Application No. 62/749,283, filed on Oct. 23, 2018, in the United States Patent & Trademark Office, the disclosure of which is incorporated herein by reference in its entirety.

FIELD

The disclosed subject matter relates to media coding and decoding, and more specifically, to the representation of multiple conformance points such as profiles, sub-profiles, tiers, or levels, in a bitstream.

BACKGROUND

Video coding and decoding using inter-picture prediction with motion compensation has been known for decades. Uncompressed digital video can consist of a series of pictures, each picture having a spatial dimension of, for example, 1920×1080 luminance samples and associated chrominance samples. The series of pictures can have a fixed or variable picture rate (informally also known as frame rate), of, for example 60 pictures per second or 60 Hz. Uncompressed video has significant bitrate requirements. For example, 1080p60 4:2:0 video at 8 bit per sample (1920×1080 luminance sample resolution at 60 Hz frame rate) requires close to 1.5 Gbit/s bandwidth. An hour of such video requires more than 600 GB of storage space.

One purpose of video coding and decoding can be the reduction of redundancy in the input video signal, through compression. Compression can help reducing aforementioned bandwidth or storage space requirements, in some cases by two orders of magnitude or more. Both lossless and lossy compression, as well as a combination thereof can be employed. Lossless compression refers to techniques where an exact copy of the original signal can be reconstructed from the compressed original signal. When using lossy compression, the reconstructed signal may not be identical to the original signal, but the distortion between original and reconstructed signal is small enough to make the reconstructed signal useful for the intended application. In the case of video, lossy compression is widely employed. The amount of distortion tolerated depends on the application; for example, users of certain consumer streaming applications may tolerate higher distortion than users of television contribution applications. The compression ratio achievable can reflect that: higher allowable/tolerable distortion can yield higher compression ratios.

A video encoder and decoder can utilize techniques from several broad categories, including, for example, motion compensation, transform, quantization, and entropy coding, some of which will be introduced below.

In order to help a decoder or an underlying system to determine whether a given coded media bitstream is decodable, and also to assist in tasks such as capability negotiation, conformance points have been introduced. For example, in MPEG and similar standards, a profile may indicate a defined subset of a collection of tools that may be present in a bitstream. For example, in H.264, the baseline profile does not include tools related to interlace coding, whereas the main profile includes such tools. Similarly, a level may indicate an upper bound of bitstream complexity. Similarly, a tier may indicate a bitstream complexity (maximum bitrate for a given temporal-spatial resolution) of a given standard.

Until around 2003, standards often introduced profiles that were onion-shaped. Levels and tiers are defined as onion-shaped even today. Onion-shaped here implies that all tools defined for "lower" profiles (usually though not always indicated by a numerically lower profile indicator value) were included in a higher profile. Referring to FIG. 1, a baseline profile (101) is shown as a small circle, fully enclosed by a larger circle indicating a main profile (102). This figure illustrates that all tools of the baseline profile (101) are also included in the main profile (102). Assume the baseline profile would be represented by a profile ID of 0, and the main profile by a profile ID of 1. As a result, comparing a single value of the profile ID as coded in the video bitstream against the profile ID the decoder or underlying system is capable of decoding was sufficient to establish whether or not a given bitstream is decodable from a profile viewpoint. For example, if a decoder were able to decode a main profile (with ID=1), then, when exposed to a baseline bitstream with ID=0, the decoder is able to decode the bitstream. Levels offer an additional dimension of bitstream complexity, often measured in a combination of processing requirements (such as: samples per second) and memory requirements (such as: maximum number of samples in a picture, or bit depth, . . . ). Levels in MPEG standards are generally onion-shaped. In order to decode a given bitstream, both profile and level of the bitstream have to be lower or equal than the profile and level of the decoder.

With the finalization of H.264 in 2003, profiles were introduced that are not onion-shaped. For example, (unconstrained) baseline of H.264 (201) includes a tool known as Flexible Macroblock Ordering (FMO) (202), whereas a main profile (203) does not include that tool. Similarly, a main profile includes tools to support interlace coding (204), that are not included in the baseline profile. Many other tools are common between both of the profiles (205). H.264 initially did not include a mechanism that allowed to indicate that a bitstream is compatible with both a baseline and a main profile. This was not considered a problem as the application spaces for baseline and main profiles were considered diverse.

In H.265, ca. 2013, once more, non-overlapping profiles were created. Here, however, the standards committee decided that an indication of compatibility with multiple profiles is desirable. The solution implemented relies on a finite and small numbering space of possible profiles; 32 in the case of H.265. The preferred profile is indicated by a five bit integer. Compatibility with the remaining 31 profiles can be indicated through a 32 bit mask, in which each bit indicates compatibility with the so-numbered profile.

Under consideration is a new video coding standard tentatively known as Versatile Video Coding, or VVC. It is anticipated that VVC will support user defined profiles or sub-profiles to reflect certain marketplace realities. As it is not clear from the outset how many profiles and sub-profiles users may create, there may be a need to support hundreds, thousands, or more profiles and/or sub-profiles. Further, as a lightweight registration mechanism for user-defined profiles is desirable, a large numbering space for user-defined profiles and/or sub-profiles is also desirable. Therefore, a representation of multiple profile compatibility through a bit mask is not practical. Similar considerations may apply to other conformance points such as levels or tiers. Further, in certain environments, it may be necessary to express compatibility with multiple conformance points of a different category in the same bitstream, such as profile and sub-profile.

SUMMARY

According to an aspect of the disclosure, a method for media decoding by a decoder, includes decoding a first indication indicative of a first conformance point of a coded video sequence; decoding a second indication indicative of a second conformance point of the coded video sequence; determining whether the coded video sequence is decodable by the decoder based on the first conformance point and the second conformance point; and selectively decoding the coded video sequence based on determining whether the coded video sequence is decodable by the decoder.

According to an aspect of the disclosure, a device for media decoding includes at least one memory configured to store program code; and at least one processor configured to read the program code and operate as instructed by the program code, the program code including: decoding code configured to cause the at least one processor to: decode a first indication indicative of a first conformance point of a coded video sequence; and decode a second indication indicative of a second conformance point of the coded video sequence; determining code configured to cause the at least one processor to determine whether the coded video sequence is decodable by the decoder based on the first indication and the second indication; and selectively decoding code configured to cause the at least one processor to selectively decode the coded video sequence based on determining whether the decoded video sequence is decodable by the decoder.

According to an aspect of the disclosure, a non-transitory computer-readable medium stores instructions, the instructions including one or more instructions that, when executed by one or more processors of a device, cause the one or more processors to: decode a first indication indicative of a first conformance point of a coded video sequence; decode a second indication indicative of a second conformance point of the coded video sequence; determine whether the coded video sequence is decodable by the device based on the first indication and the second indication; and selectively decode the coded video sequence based on determining whether the decoded video sequence is decodable by the device.

BRIEF DESCRIPTION OF THE DRAWINGS

Further features, the nature, and various advantages of the disclosed subject matter will be more apparent from the following detailed description and the accompanying drawings in which:

FIG. 4 is a schematic illustration of a simplified block diagram of a decoder in accordance with an embodiment.

FIG. 5 is a schematic illustration of a simplified block diagram of an encoder in accordance with an embodiment.

FIG. 6 is a syntax diagram of a syntax supporting multiple conformance points.

FIG. 8 is a schematic illustration of a computer system in accordance with an embodiment.

PROBLEM TO BE SOLVED

At least VVC sub-profiles are currently anticipated to allow millions, if not billions, of choices, and possibly more if self-registration of sub-profiles through mechanisms such as UUID (which are 16 bytes in length and therefore allow for up to $2^{\wedge}(8*16)$ sub-profiles, URIs (which are strings of practically infinite length but typically in the 10 to 100 character range, allowing $2^{\wedge}(8*100)$ sub-profiles assuming 100 characters), or T.35 strings (which, to be practical, should be at least 3 octets long, along $2^{\wedge}24$ sub-profiles). Even the smallest of these options, T.35, would require a $2^{\wedge}24$ sized bitmask, which is impractical for media coding. Accordingly, a novel mechanism is required to indicate bitstream compatibility with more than one profile or sub-profile.

DETAILED DESCRIPTION

Figure 1:
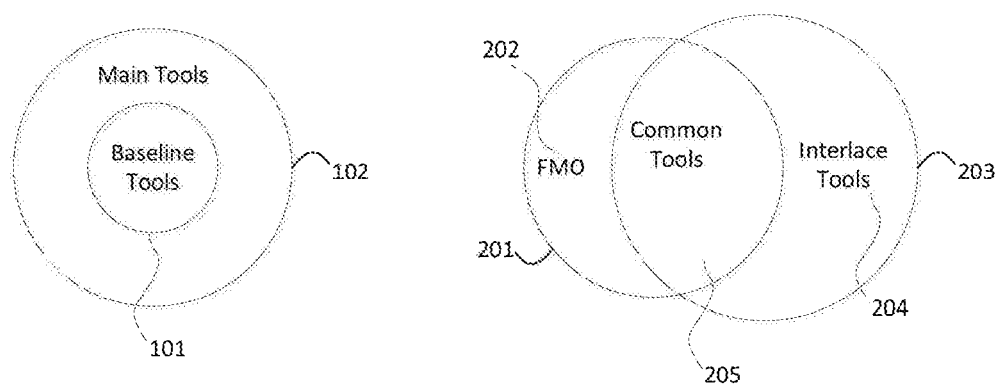
FIG. 1 is a schematic illustration of profiles in accordance with related art.
Figure 2:
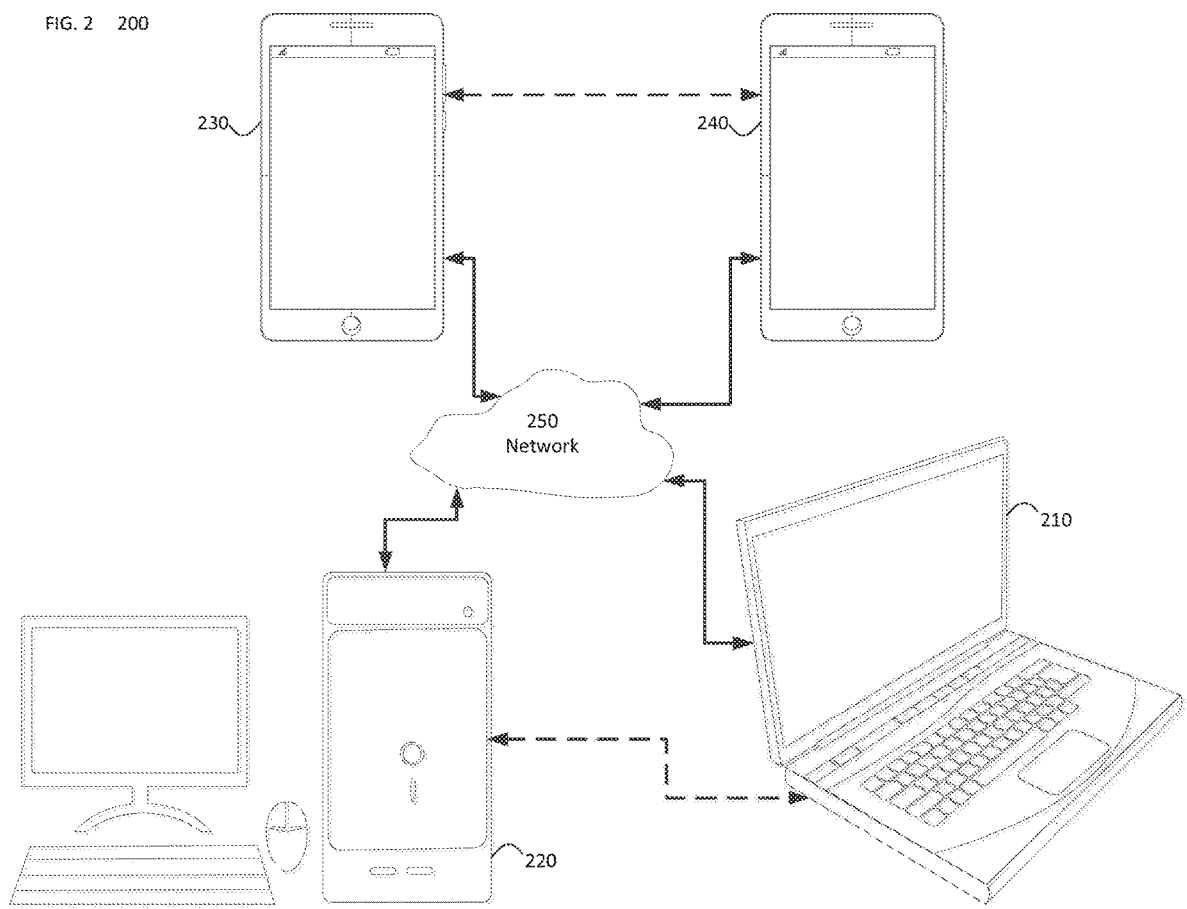
FIG. 2 is a schematic illustration of a simplified block diagram of a communication system in accordance with an embodiment.

FIG. 2 illustrates a simplified block diagram of a communication system (200) according to an embodiment of the present disclosure. The system (200) may include at least two terminals (210-220) interconnected via a network (250). For unidirectional transmission of data, a first terminal (210) may code video data at a local location for transmission to the other terminal (220) via the network (250). The second terminal (220) may receive the coded video data of the other terminal from the network (250), decode the coded data and display the recovered video data. Unidirectional data transmission may be common in media serving applications and the like.

FIG. 2 illustrates a second pair of terminals (230, 240) provided to support bidirectional transmission of coded video that may occur, for example, during videoconferencing. For bidirectional transmission of data, each terminal (230, 240) may code video data captured at a local location for transmission to the other terminal via the network (250). Each terminal (230, 240) also may receive the coded video data transmitted by the other terminal, may decode the coded data and may display the recovered video data at a local display device.

In FIG. 2, the terminals (210-240) may be illustrated as servers, personal computers and smart phones but the principles of the present disclosure may be not so limited. Embodiments of the present disclosure find application with laptop computers, tablet computers, media players and/or dedicated video conferencing equipment. The network (250) represents any number of networks that convey coded video data among the terminals (210-240), including for example wireline and/or wireless communication networks. The communication network (250) may exchange data in circuit-switched and/or packet-switched channels. Representative networks include telecommunications networks, local area networks, wide area networks and/or the Internet. For the purposes of the present discussion, the architecture and topology of the network (250) may be immaterial to the operation of the present disclosure unless explained herein below.

Figure 3:
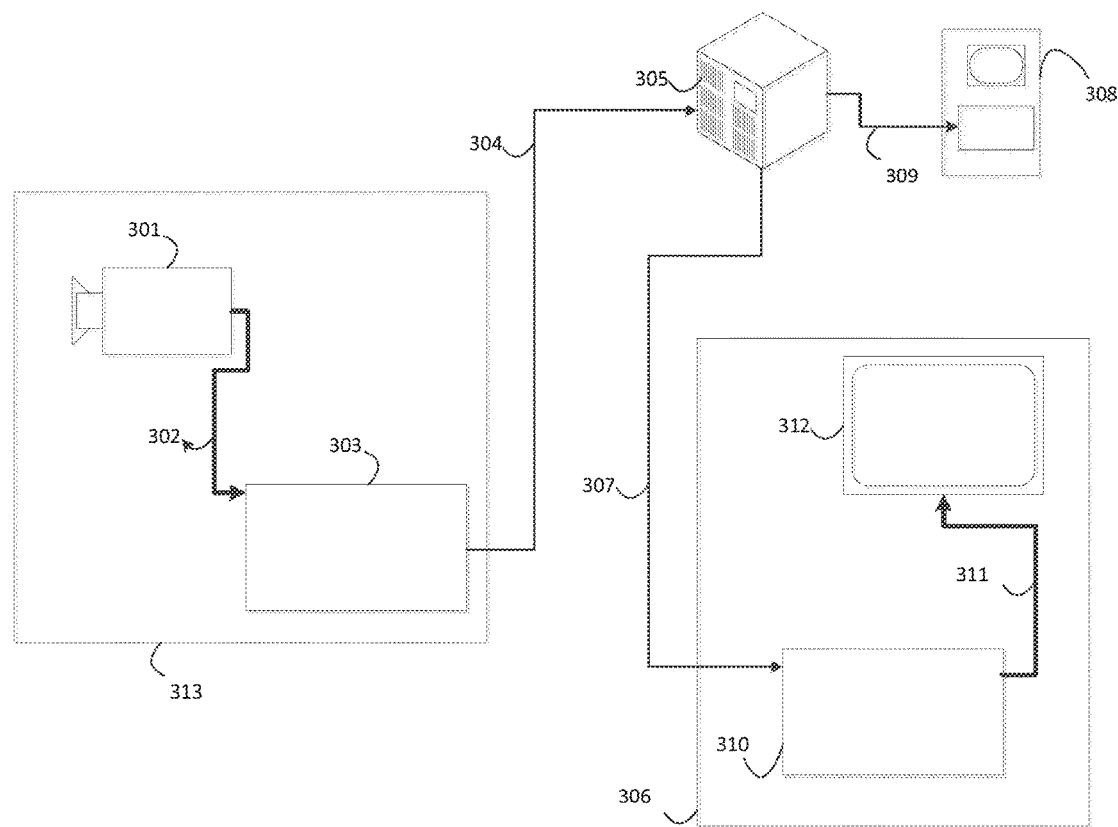
FIG. 3 is a schematic illustration of a simplified block diagram of a communication system in accordance with an embodiment.

FIG. 3 illustrates, as an example for an application for the disclosed subject matter, the placement of a video encoder and decoder in a streaming environment. The disclosed subject matter can be equally applicable to other video enabled applications, including, for example, video conferencing, digital TV, storing of compressed video on digital media including CD, DVD, memory stick and the like, and so on.

A streaming system may include a capture subsystem (313), that can include a video source (301), for example a digital camera, creating a for example uncompressed video sample stream (302). That sample stream (302), depicted as a bold line to emphasize a high data volume when compared to encoded video bitstreams, can be processed by an encoder (303) coupled to the camera (301). The encoder (303) can include hardware, software, or a combination thereof to enable or implement aspects of the disclosed subject matter as described in more detail below. The encoded video bitstream (304), depicted as a thin line to emphasize the lower data volume when compared to the sample stream, can be stored on a streaming server (305) for future use. One or more streaming clients (306, 308) can access the streaming server (305) to retrieve copies (307, 309) of the encoded video bitstream (304). A client (306) can include a video decoder (310) which decodes the incoming copy of the encoded video bitstream (307) and creates an outgoing video sample stream (311) that can be rendered on a display (312) or other rendering device (not depicted). In some streaming systems, the video bitstreams (304, 307, 309) can be encoded according to certain video coding/compression standards. Examples of those standards include ITU-T Recommendation H.265. Under development is a video coding standard informally known as Versatile Video Coding or VVC. The disclosed subject matter may be used in the context of VVC.

FIG. 4 may be a functional block diagram of a video decoder (310) according to an embodiment of the present invention.

A receiver (410) may receive one or more codec video sequences to be decoded by the decoder (310); in the same or another embodiment, one coded video sequence at a time, where the decoding of each coded video sequence is independent from other coded video sequences. The coded video sequence may be received from a channel (412), which may be a hardware/software link to a storage device which stores the encoded video data. The receiver (410) may receive the encoded video data with other data, for example, coded audio data and/or ancillary data streams, that may be forwarded to their respective using entities (not depicted). The receiver (410) may separate the coded video sequence from the other data. To combat network jitter, a buffer memory (415) may be coupled in between receiver (410) and entropy decoder/parser (420) ("parser" henceforth). When receiver (410) is receiving data from a store/forward device of sufficient bandwidth and controllability, or from an isosychronous network, the buffer (415) may not be needed, or can be small. For use on best effort packet networks such as the Internet, the buffer (415) may be required, can be comparatively large and can advantageously of adaptive size.

The video decoder (310) may include an parser (420) to reconstruct symbols (421) from the entropy coded video sequence. Categories of those symbols include information used to manage operation of the decoder (310), and potentially information to control a rendering device such as a display (312) that is not an integral part of the decoder but can be coupled to it, as was shown in FIG. 3. The control information for the rendering device(s) may be in the form of Supplementary Enhancement Information (SEI messages) or Video Usability Information (VUI) parameter set fragments (not depicted). The parser (420) may parse/ entropy-decode the coded video sequence received. The coding of the coded video sequence can be in accordance with a video coding technology or standard, and can follow principles well known to a person skilled in the art, including variable length coding, Huffman coding, arithmetic coding with or without context sensitivity, and so forth. The parser (420) may extract from the coded video sequence, a set of subgroup parameters for at least one of the subgroups of pixels in the video decoder, based upon at least one parameters corresponding to the group. Subgroups can include Groups of Pictures (GOPs), pictures, tiles, slices, macroblocks, Coding Units (CUs), blocks, Transform Units (TUs), Prediction Units (PUs) and so forth. The entropy decoder/parser may also extract from the coded video sequence information such as transform coefficients, quantizer parameter values, motion vectors, and so forth.

The parser (420) may perform entropy decoding/parsing operation on the video sequence received from the buffer (415), so to create symbols (421).

Reconstruction of the symbols (421) can involve multiple different units depending on the type of the coded video picture or parts thereof (such as: inter and intra picture, inter and intra block), and other factors. Which units are involved, and how, can be controlled by the subgroup control information that was parsed from the coded video sequence by the parser (420). The flow of such subgroup control information between the parser (420) and the multiple units below is not depicted for clarity.

Beyond the functional blocks already mentioned, decoder 310 can be conceptually subdivided into a number of functional units as described below. In a practical implementation operating under commercial constraints, many of these units interact closely with each other and can, at least partly, be integrated into each other. However, for the purpose of describing the disclosed subject matter, the conceptual subdivision into the functional units below is appropriate.

A first unit is the scaler/inverse transform unit (451). The scaler/inverse transform unit (451) receives quantized transform coefficient as well as control information, including which transform to use, block size, quantization factor, quantization scaling matrices, etc. as symbol(s) (421) from the parser (420). It can output blocks comprising sample values, that can be input into aggregator (455).

In some cases, the output samples of the scaler/inverse transform (451) can pertain to an intra coded block; that is: a block that is not using predictive information from previously reconstructed pictures, but can use predictive information from previously reconstructed parts of the current picture. Such predictive information can be provided by an intra picture prediction unit (452). In some cases, the intra picture prediction unit (452) generates a block of the same size and shape of the block under reconstruction, using surrounding already reconstructed information fetched from the current (partly reconstructed) picture (456). The aggregator (455), in some cases, adds, on a per sample basis, the prediction information the intra prediction unit (452) has generated to the output sample information as provided by the scaler/inverse transform unit (451).

In other cases, the output samples of the scaler/inverse transform unit (451) can pertain to an inter coded, and potentially motion compensated block. In such a case, a Motion Compensation Prediction unit (453) can access reference picture memory (457) to fetch samples used for prediction. After motion compensating the fetched samples in accordance with the symbols (421) pertaining to the block, these samples can be added by the aggregator (455)

to the output of the scaler/inverse transform unit (in this case called the residual samples or residual signal) so to generate output sample information. The addresses within the reference picture memory form where the motion compensation unit fetches prediction samples can be controlled by motion vectors, available to the motion compensation unit in the form of symbols (421) that can have, for example X, Y, and reference picture components. Motion compensation also can include interpolation of sample values as fetched from the reference picture memory when sub-sample exact motion vectors are in use, motion vector prediction mechanisms, and so forth.

The output samples of the aggregator (455) can be subject to various loop filtering techniques in the loop filter unit (456). Video compression technologies can include in-loop filter technologies that are controlled by parameters included in the coded video bitstream and made available to the loop filter unit (456) as symbols (421) from the parser (420), but can also be responsive to meta-information obtained during the decoding of previous (in decoding order) parts of the coded picture or coded video sequence, as well as responsive to previously reconstructed and loop-filtered sample values.

The output of the loop filter unit (456) can be a sample stream that can be output to the render device (312) as well as stored in the reference picture memory (456) for use in future inter-picture prediction.

Certain coded pictures, once fully reconstructed, can be used as reference pictures for future prediction. Once a coded picture is fully reconstructed and the coded picture has been identified as a reference picture (by, for example, parser (420)), the current reference picture (456) can become part of the reference picture buffer (457), and a fresh current picture memory can be reallocated before commencing the reconstruction of the following coded picture.

The video decoder 420 may perform decoding operations according to a predetermined video compression technology that may be documented in a standard, such as ITU-T Rec. H.265. The coded video sequence may conform to a syntax specified by the video compression technology or standard being used, in the sense that it adheres to the syntax of the video compression technology or standard, as specified in the video compression technology document or standard and specifically in the profiles document therein. Also necessary for compliance can be that the complexity of the coded video sequence is within bounds as defined by the level of the video compression technology or standard. In some cases, levels restrict the maximum picture size, maximum frame rate, maximum reconstruction sample rate (measured in, for example megasamples per second), maximum reference picture size, and so on. Limits set by levels can, in some cases, be further restricted through Hypothetical Reference Decoder (HRD) specifications and metadata for HRD buffer management signaled in the coded video sequence.

In an embodiment, the receiver (410) may receive additional (redundant) data with the encoded video. The additional data may be included as part of the coded video sequence(s). The additional data may be used by the video decoder (420) to properly decode the data and/or to more accurately reconstruct the original video data. Additional data can be in the form of, for example, temporal, spatial, or SNR enhancement layers, redundant slices, redundant pictures, forward error correction codes, and so on.

FIG. 5 may be a functional block diagram of a video encoder (303) according to an embodiment of the present disclosure.

The encoder (303) may receive video samples from a video source (301) (that is not part of the encoder) that may capture video image(s) to be coded by the encoder (303).

The video source (301) may provide the source video sequence to be coded by the encoder (303) in the form of a digital video sample stream that can be of any suitable bit depth (for example: 8 bit, 10 bit, 12 bit, . . . ), any colorspace (for example, BT.601 Y CrCB, RGB, . . . ) and any suitable sampling structure (for example Y CrCb 4:2:0, Y CrCb 4:4:4). In a media serving system, the video source (301) may be a storage device storing previously prepared video. In a videoconferencing system, the video source (303) may be a camera that captures local image information as a video sequence. Video data may be provided as a plurality of individual pictures that impart motion when viewed in sequence. The pictures themselves may be organized as a spatial array of pixels, wherein each pixel can comprise one or more sample depending on the sampling structure, color space, etc. in use. A person skilled in the art can readily understand the relationship between pixels and samples. The description below focusses on samples.

According to an embodiment, the encoder (303) may code and compress the pictures of the source video sequence into a coded video sequence (543) in real time or under any other time constraints as required by the application. Enforcing appropriate coding speed is one function of Controller (550). Controller controls other functional units as described below and is functionally coupled to these units. The coupling is not depicted for clarity. Parameters set by controller can include rate control related parameters (picture skip, quantizer, lambda value of rate-distortion optimization techniques, . . . ), picture size, group of pictures (GOP) layout, maximum motion vector search range, and so forth. A person skilled in the art can readily identify other functions of controller (550) as they may pertain to video encoder (303) optimized for a certain system design.

Some video encoders operate in what a person skilled in the are readily recognizes as a "coding loop". As an over-simplified description, a coding loop can consist of the encoding part of an encoder (530) ("source coder" henceforth) (responsible for creating symbols based on an input picture to be coded, and a reference picture(s)), and a (local) decoder (533) embedded in the encoder (303) that reconstructs the symbols to create the sample data a (remote) decoder also would create (as any compression between symbols and coded video bitstream is lossless in the video compression technologies considered in the disclosed subject matter). That reconstructed sample stream is input to the reference picture memory (534). As the decoding of a symbol stream leads to bit-exact results independent of decoder location (local or remote), the reference picture buffer content is also bit exact between local encoder and remote encoder. In other words, the prediction part of an encoder "sees" as reference picture samples exactly the same sample values as a decoder would "see" when using prediction during decoding. This fundamental principle of reference picture synchronicity (and resulting drift, if synchronicity cannot be maintained, for example because of channel errors) is well known to a person skilled in the art.

The operation of the "local" decoder (533) can be the same as of a "remote" decoder (310), which has already been described in detail above in conjunction with FIG. 4. Briefly referring also to FIG. 4, however, as symbols are available and en/decoding of symbols to a coded video sequence by entropy coder (545) and parser (420) can be lossless, the entropy decoding parts of decoder (310), including channel (412), receiver (410), buffer (415), and parser (420) may not be fully implemented in local decoder (533).

An observation that can be made at this point is that any decoder technology except the parsing/entropy decoding that is present in a decoder also necessarily needs to be present, in substantially identical functional form, in a corresponding encoder. For this reason, the disclosed subject matter focusses on decoder operation. The description of encoder technologies can be abbreviated as they are the inverse of the comprehensively described decoder technologies. Only in certain areas a more detail description is required and provided below.

As part of its operation, the source coder (530) may perform motion compensated predictive coding, which codes an input frame predictively with reference to one or more previously-coded frames from the video sequence that were designated as "reference frames." In this manner, the coding engine (532) codes differences between pixel blocks of an input frame and pixel blocks of reference frame(s) that may be selected as prediction reference(s) to the input frame.

The local video decoder (533) may decode coded video data of frames that may be designated as reference frames, based on symbols created by the source coder (530). Operations of the coding engine (532) may advantageously be lossy processes. When the coded video data may be decoded at a video decoder (not shown in FIG. 5), the reconstructed video sequence typically may be a replica of the source video sequence with some errors. The local video decoder (533) replicates decoding processes that may be performed by the video decoder on reference frames and may cause reconstructed reference frames to be stored in the reference picture cache (534). In this manner, the encoder (303) may store copies of reconstructed reference frames locally that have common content as the reconstructed reference frames that will be obtained by a far-end video decoder (absent transmission errors).

The predictor (535) may perform prediction searches for the coding engine (532). That is, for a new frame to be coded, the predictor (535) may search the reference picture memory (534) for sample data (as candidate reference pixel blocks) or certain metadata such as reference picture motion vectors, block shapes, and so on, that may serve as an appropriate prediction reference for the new pictures. The predictor (535) may operate on a sample block-by-pixel block basis to find appropriate prediction references. In some cases, as determined by search results obtained by the predictor (535), an input picture may have prediction references drawn from multiple reference pictures stored in the reference picture memory (534).

The controller (550) may manage coding operations of the video coder (530), including, for example, setting of parameters and subgroup parameters used for encoding the video data.

Output of all aforementioned functional units may be subjected to entropy coding in the entropy coder (545). The entropy coder translates the symbols as generated by the various functional units into a coded video sequence, by loss-less compressing the symbols according to technologies known to a person skilled in the art as, for example Huffman coding, variable length coding, arithmetic coding, and so forth.

The transmitter (540) may buffer the coded video sequence(s) as created by the entropy coder (545) to prepare it for transmission via a communication channel (560), which may be a hardware/software link to a storage device which would store the encoded video data. The transmitter (540) may merge coded video data from the video coder (530) with other data to be transmitted, for example, coded audio data and/or ancillary data streams (sources not shown).

The controller (550) may manage operation of the encoder (303). During coding, the controller (550) may assign to each coded picture a certain coded picture type, which may affect the coding techniques that may be applied to the respective picture. For example, pictures often may be assigned as one of the following frame types:

An Intra Picture (I picture) may be one that may be coded and decoded without using any other frame in the sequence as a source of prediction. Some video codecs allow for different types of Intra pictures, including, for example Independent Decoder Refresh Pictures. A person skilled in the art is aware of those variants of I pictures and their respective applications and features.

A Predictive picture (P picture) may be one that may be coded and decoded using intra prediction or inter prediction using at most one motion vector and reference index to predict the sample values of each block.

A Bi-directionally Predictive Picture (B Picture) may be one that may be coded and decoded using intra prediction or inter prediction using at most two motion vectors and reference indices to predict the sample values of each block. Similarly, multiple-predictive pictures can use more than two reference pictures and associated metadata for the reconstruction of a single block.

Source pictures commonly may be subdivided spatially into a plurality of sample blocks (for example, blocks of 4×4, 8×8, 4×8, or 16×16 samples each) and coded on a block-by-block basis. Blocks may be coded predictively with reference to other (already coded) blocks as determined by the coding assignment applied to the blocks' respective pictures. For example, blocks of I pictures may be coded non-predictively or they may be coded predictively with reference to already coded blocks of the same picture (spatial prediction or intra prediction). Pixel blocks of P pictures may be coded non-predictively, via spatial prediction or via temporal prediction with reference to one previously coded reference pictures. Blocks of B pictures may be coded non-predictively, via spatial prediction or via temporal prediction with reference to one or two previously coded reference pictures.

The video coder (303) may perform coding operations according to a predetermined video coding technology or standard, such as ITU-T Rec. H.265. In its operation, the video coder (303) may perform various compression operations, including predictive coding operations that exploit temporal and spatial redundancies in the input video sequence. The coded video data, therefore, may conform to a syntax specified by the video coding technology or standard being used.

In an embodiment, the transmitter (540) may transmit additional data with the encoded video. The video coder (530) may include such data as part of the coded video sequence. Additional data may comprise temporal/spatial/SNR enhancement layers, other forms of redundant data such as redundant pictures and slices, Supplementary Enhancement Information (SEI) messages, Visual Usability Information (VUI) parameter set fragments, and so on.

In the following, assumed is a profile representation through an 8 bit bitstring (as common in older video coding standards and technologies, and a sub-profile representation through a T.35 string. ITU-T Rec. T.35 specifies a registration format, composed of a minimum of two octets. The first octet carries a country code of a United Nations member country. In order to obtain a registration, an entity (such as a business or, in some countries, an individual) can approach the local regulatory authorities and request one of 256 codepoints coded in the second octet. Within the organization, a third, fourth, fifth, etc. octet can be allocated. The content of these two or more octets in a T.35 string can be registered. Additional octets can be added to the T.35 string as needed, allowing an increase in numbering space, though the administration of that numbering space is delegated to the business or individual identified through first and second octet.

The disclosed subject matter is not limited to profile or sub-profile representation through T.35 strings. Other options include Uniform Resource Identifiers (URIs, character strings that can be registered through IANA), Universally unique identifier (UUIDs 128 bits in length, self-registration, relying on hashing functions and a huge numbering space for uniqueness), and so forth. The distinguishing difference between the profile and sub-profile identifications as disclosed herein, and the traditional profile ids as used in MPEG and other media standards, is that herein the numbering space of profile or sub-profile, or a combination of the two, is too large to be reasonably represented by a bitmask. In other words, the numbering space may be so large that the coding of the bitmask, alone, may contradict the goal of many media coding standards, namely compression.

In the following, described is the signaling of multiple conformance point using profiles and sub-profiles as an example. However, the disclosed subject matter can equally be used for other, non-onion shaped conformance points. Conceivably, levels may not be onion-shaped—for example, consider levels covering only certain 4:3 aspect ratios video images and other covering only certain 9:16 aspect ratio video images; still others being agnostic to the aspect ratio as levels are currently in H.265. While such level definitions may be uncommon in MPEG's history, they are in use in certain application standards.

Referring to FIG. 6, and in accordance with an embodiment, one or more sub-profiles represented by a T.35 string, a UUID, a URI, or similar representation of at least 24 bits in length, can be coded into a bitstream in the form of a list of strings (604). Each string can have a fixed, pre-determined length or a variable length using a termination symbol. For example, T.35 strings as used in the disclosed subject matter can have a pre-determined length of, for example, 3, 4, 5, etc. octets. A UUID, by definition, has a length of 128 bits or 16 octets. A URI can be formed as a zero-terminated string, where an octet with a value of zero marks the end of the string and the string can be of variable length. Shown below is a syntax diagram assuming a four octet representation of a T.35 string.

Referring to FIG. 6, in the same or another embodiment, the list can, in a syntax diagram (601), readily be represented in the form of a loop (603) with a fixed number of iterations. A syntax element "num_sub_profiles" (602) can indicate the number of sub-profiles to be represented. That syntax element (602) may be fixed length binary coded, variable length coded, or follow any other suitable coding scheme. Shown, is a variable-length coded syntax element as indicated by ue (v).

In environments where the sub-profiling mechanism is optional, the syntax element can be variable length coded using the ue(v) definition of H.264 or H.265, with a single-bit representation indicating a number of zero sub-profiles to be included in the sub-profile list. When used for profiles, it can be advantageous to signal at least one profile, and therefore the single bit value of the ue(v) coding scheme can be assigned to the coding of one profile, making that the minimum required without a syntax violation.

The sub-profile indicators (604) can be represented in any suitable entropy coding format. Shown here is a bit string of 32 bits, denoted by b(32). This bit string is sufficient to code a four octet T.35 representation of a sub-profile ID. Other length of the sub-profile indicator (604) are also possible. In particular, a minimum sensible length for a T.35 coded sub-profile indicator can be 24 bits; 8 bits for the country code, 8 bits for the terminal provider code, and 8 bits for the sub-profile code defined by that terminal provider in that country.

The syntax structure (601) can be included, for example, in a high level parameter set such as a decoder parameter set, video parameter set (VPS, as defined in H.265), sequence parameter set (SPS, as defined in H.264 and H.265), as well as in high level header structures such as a sequence header, GOP header, or picture header as defined in MPEG-2 or MPEG-4. The syntax structure may also be available outside of the bitstream, for example in the form of metadata to be used in protocols for capability announcement or exchange. Therein, it can be coded, for example, in syntax such as ASN.1, SDP, XML, and so forth.

A bitstream conformance point may also be defined as a combination of multiple conformance points as described here. For example, a bitstream conformance point may be defined as the combination of a profile ID, that can be, for example, represented by an 8 bit fixed length codeword, and a sub-profile ID that can be represented by a T.35 string. In that case, the T.35 string may identify a sub-profile identified by the profile ID. As a consequence, the same sub-profile ID may identify different bitstream conformance points, depending on the profile.

There are many possible uses for the presence of multiple conformance points in a bitstream or in the form of metadata according to the above mechanism, or mechanisms substantially similar to it.

As an example, consider the existence of multiple decoder ecosystems, each perhaps slightly different from each other. Such ecosystems may be certain national standards (for example, ATSC in the US, DVB in Europe, ARIB in Japan), each of which requiring sub-profiling a "main" profile according to national or regional preferences or needs. Also consider multiple "walled garden" ecosystems, each with slightly different decoder requirements. For example, consider Tencent, Netflix, Hulu, and Youtube.

Now consider a content provider who wants to serve content to multiple ecosystems without running multiple encoders. Doing so has many commercial advantages. The content provider may well know the detailed requirements of all the ecosystems that it wants to serve, along with their sub-profiling T.35 strings. As long as the requirements between ecosystems are not contradictory, the content provider can use a least common denominator approach to identify the maximum toolset that on one hand allows for optional compression performance under the circumstances, but on the other hand still allows for decoding by decoders of all targeted ecosystems.

The content provider encodes the source material according to that least common denominator approach, indicates "main profile" as the profile, and indicates sub-profiles for all for example ATSC, DVB, and ARIB. Each ATSC, DVB, and ARIB may have registered their relevant sub-profile IDs with suitable registration authorities; in the case of T.35, for example, with the ITU-T and/or with local registration authorities as prescribed by the relevant local regulatory authorities. For example, ATSC, may have registered its relevant sub-profiles with the US regulatory authority, and received a four octet T.35 string, starting with an octet equal to 181 (country code for the US), and exemplary values of 01, 02, and 03 for the remaining three octets. Similarly, DVB may have received a four octet string equal to 66, 04, 05, 06, and ARIB may received a string equal to 00 07 08 09. The resulting sub-profile table could look as follows:

| | |
|---|---|
| num_sub_profile = | 2 |
| sub_profile_t35_string[0] = | 181 01 02 03 |
| sub_profile_t35_string[1] = | 66 04 05 06 |
| sub_profile_t35_string[2] = | 00 07 08 09 |

At present, ecosystem decoders widely expect a given profile ID, often main, but silent observance of other constraints as required by the given ecosystem. Such compatibility can be indicated in a sub-profile ID. Consider a content server that has obtained the bitstream from the content provider. That content server can parse the sub-profile IDs to check whether a given bitstream is compatible with the ecosystem, and only offer it and serve it if it is compatible.

In the above example, consider a content server located in Japan and following ARIB standards, that has received a bitstream from a third party provider located in Russia. The bitstream may indicate main profile. With that information alone and absent the disclosed subject matter, the content server has no knowledge of whether decoders in Japan, working according ARIB standards, can meaningfully receive and decode the Russian bitstream, at least not without parsing the whole bitstream to ensure ARIB specification compatibility. However, if the bitstream is marked as indicated above, the content server can parse the high level syntax structure in which he can expect the sub-profile strings. When it finds a sub-profile indication including an ARIB designation, it can assume that the bitstream was encoded observing the requirements of the ARIB standards and readily serve it to (ARIB-compliant) decoders. Similarly, a content server located in Germany and expecting DVB-compliant content, or a content server located in the US and expecting ATSC compliant content can equally serve the bitstream to their respective decoders.

As an alternative, certain ecosystem decoders may require an appropriate sub-profile ID to be present in the bitstream before even attempting decoding.

Figure 7:
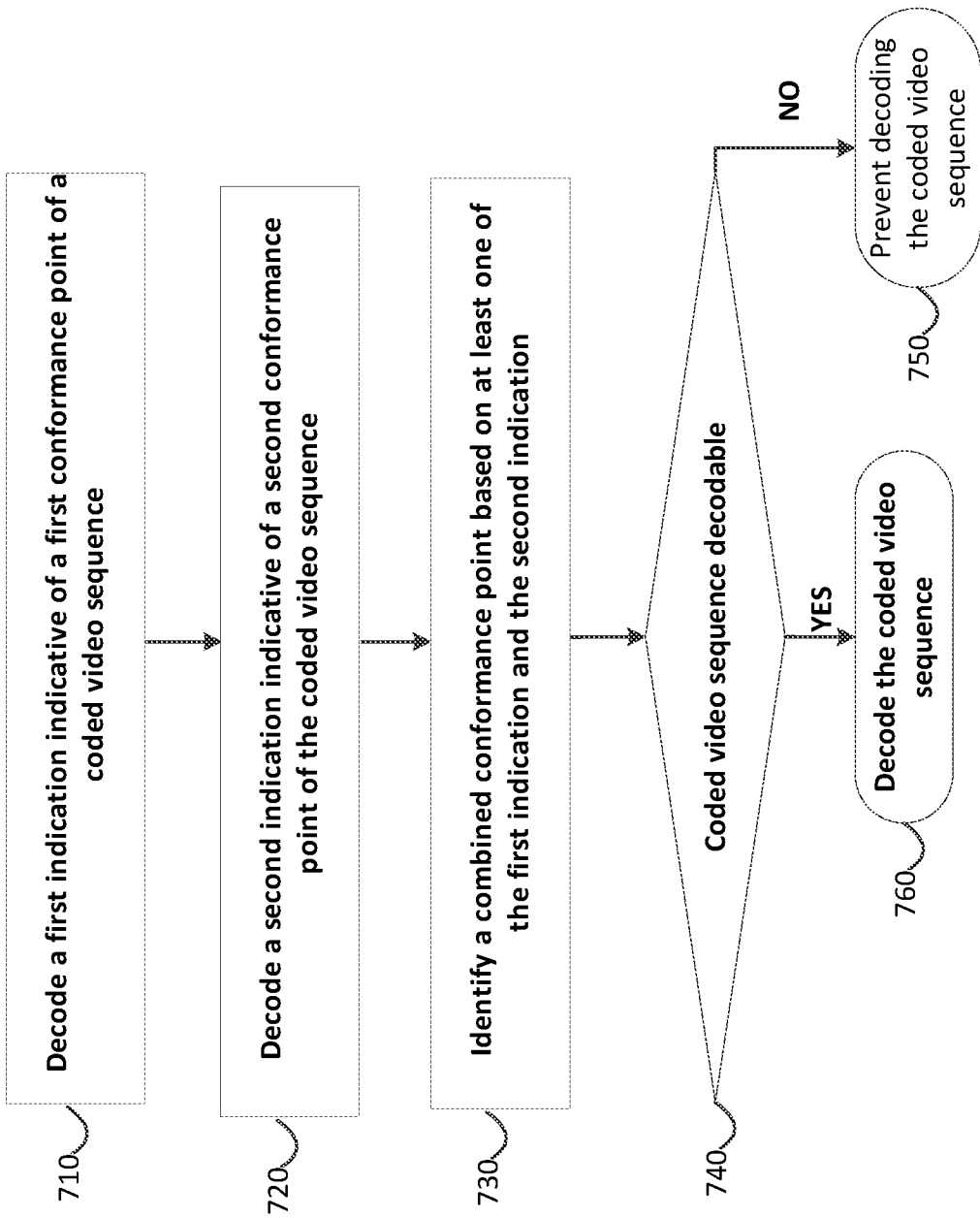
FIG. 7 is a flowchart of an example process in accordance with an embodiment.

FIG. 7 is a flowchart of an example process in accordance with an embodiment.

As shown in FIG. 7, process 700 may include decoding a first indication indicative of a first conformance point of a coded video sequence (block 710).

As further shown in FIG. 7, process 700 may include decoding a second indication indicative of a second conformance point of the coded video sequence (block 720).

As further shown in FIG. 7, process 700 may include identifying a combined conformance point based on the first indication and the second indication (block 730).

As further shown in FIG. 7, process 700 may include determining whether the coded video sequence is decodable by the decoder (block 740).

As further shown in FIG. 7, process 700 may include selectively decoding the coded video sequence based on determining whether the coded video sequence is decodable by the decoder. For example, if the coded video sequence is not decodable by the decoder (block 740—NO), then process 700 may include preventing the decoding of the coded video sequence (block 750). Alternatively, if the coded video sequence is decodable by the decoder (block 740—YES), then process 700 may include decoding the coded video sequence (block 760).

Additionally, or alternatively, process 700 may include decoding a first indication indicative of a first conformance point of a coded video sequence. Further, process 700 may include decoding a second indication indicative of a second conformance point of the coded video sequence. Further, process 700 may include determining whether the coded video sequence is decodable by the decoder based on at least one of the first conformance point and the second conformance point. Further still, process 700 may include selectively decoding the coded video sequence based on determining whether the coded video sequence is decodable by the decoder.

In some cases, the first indication is coded according to ITU-T Rec. T.35. Additionally, or alternatively, the first indication is one of a plurality of first indications present in a first high level syntax structure, and the first high level syntax structure pertains to at least the coded video sequence. Additionally, or alternatively, the plurality of first indications is organized as a list of first indications and a number of first indications in the list is coded in the high level syntax structure as a variable length, unsigned codeword.

In some cases, the first indication is present in a first high level syntax structure and the second indication is present in a second high level syntax structure, and the first high level syntax structure is different than the second high level syntax structure.

In some cases, the first indication is coded as an octet string of at least three octets in length, and the first indication is a sub-profile of the second indication.

In some cases, process 700 includes combining the first indication and the second indication, and identifying a combined conformance point based on combining the first indication and the second indication. Additionally, or alternatively, process 700 includes comparing the combined conformance point and capability information of the decoder, and determining whether the coded video sequence is decodable by the decoder based on comparing the combined conformance point and the capability information of the decoder.

In some cases, a media bitstream conforms to both of the first conformance point and the second conformance point.

The techniques for signaling multiple conformance points in media coding, described above, can be implemented as computer software using computer-readable instructions and physically stored in one or more computer-readable media. For example, FIG. 8 shows a computer system 800 suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

The components shown in FIG. 8 for computer system 800 are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system 800.

Computer system 800 may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard 801, mouse 802, trackpad 803, touch screen 810, data-glove 804, joystick 805, microphone 806, scanner 807, camera 808.

Computer system 800 may also include certain human interface output devices. Such human interface output devices may be stimulating the senses of one or more human users through, for example, tactile output, sound, light, and smell/taste. Such human interface output devices may include tactile output devices (for example tactile feedback by the touch-screen 810, data-glove 804, or joystick 805, but there can also be tactile feedback devices that do not serve as input devices), audio output devices (such as: speakers 809, headphones (not depicted)), visual output devices (such as screens 810 to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system 800 can also include human accessible storage devices and their associated media such as optical media including CD/DVD ROM/RW 820 with CD/DVD or the like media 821, thumb-drive 822, removable hard drive or solid state drive 823, legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system 800 can also include interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (849) (such as, for example USB ports of the computer system 800; others are commonly integrated into the core of the computer system 800 by attachment to a system bus as described below (for example Ethernet interface into a PC computer system or cellular network interface into a smartphone computer system). Using any of these networks, computer system 800 can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core 840 of the computer system 800.

The core 840 can include one or more Central Processing Units (CPU) 841, Graphics Processing Units (GPU) 842, specialized programmable processing units in the form of Field Programmable Gate Areas (FPGA) 843, hardware accelerators for certain tasks 844, and so forth. These devices, along with Read-only memory (ROM) 845, Random-access memory 846, internal mass storage such as internal non-user accessible hard drives, SSDs, and the like 847, may be connected through a system bus 848. In some computer systems, the system bus 848 can be accessible in the form of one or more physical plugs to enable extensions by additional CPUs, GPU, and the like. The peripheral devices can be attached either directly to the core's system bus 848, or through a peripheral bus 849. Architectures for a peripheral bus include PCI, USB, and the like.

CPUs 841, GPUs 842, FPGAs 843, and accelerators 844 can execute certain instructions that, in combination, can make up the aforementioned computer code. That computer code can be stored in ROM 845 or RAM 846. Transitional data can be also be stored in RAM 846, whereas permanent data can be stored for example, in the internal mass storage 847. Fast storage and retrieve to any of the memory devices can be enabled through the use of cache memory, that can be closely associated with one or more CPU 841, GPU 842, mass storage 847, ROM 845, RAM 846, and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture 800, and specifically the core 840 can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core 840 that are of non-transitory nature, such as core-internal mass storage 847 or ROM 845. The software implementing various embodiments of the present disclosure can be stored in such devices and executed by core 840. A computer-readable medium can include one or more memory devices or chips, according to particular needs. The software can cause the core 840 and specifically the processors therein (including CPU, GPU, FPGA, and the like) to execute particular processes or particular parts of particular processes described herein, including defining data structures stored in RAM 846 and modifying such data structures according to the processes defined by the software. In addition or as an alternative, the computer system can provide functionality as a result of logic hardwired or otherwise embodied in a circuit (for example: accelerator 844), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

The invention claimed is:

1. A method for media decoding by a decoder, comprising:
    decoding, from a syntax structure, a first indication, said first indication being an ITU-T Rec. T.35 string, indicative of a first sub-profile that identifies a first defined set of tools capable of being used by an encoder to encode a video sequence to generate a coded video sequence that conforms to the first sub-profile and capable of being used by the decoder to decode the coded video sequence that conforms to the first sub-profile;
    decoding, from the syntax structure, a second indication, said second indication being an ITU-T Rec. T.35 string, indicative of a second sub-profile that identifies a second defined set of tools capable of being used by the encoder to encode the video sequence to generate the coded video sequence that conforms to the second sub-profile and capable of being used by the decoder to decode the coded video sequence that conforms to the second sub-profile;
    combining the first indication indicative of the first sub-profile that identifies the first defined set of tools capable of being used by the encoder to encode the video sequence to generate the coded video sequence that conforms to the first sub-profile and capable of being used by the decoder to decode the coded video sequence that conforms to the first sub-profile and the second indication indicative of the second sub-profile that identifies the second defined set of tools capable of being used by the encoder to encode the video sequence to generate the coded video sequence that conforms to the second sub-profile and capable of being used by the decoder to decode the coded video sequence that conforms to the second sub-profile;
    identifying a combined conformance point based on combining the first indication and the second indication;
    comparing the combined conformance point and capability information of the decoder;
    determining whether the coded video sequence is decodable by the decoder based on comparing the combined conformance point and the capability information of the decoder; and
    selectively decoding the coded video sequence based on determining whether the coded video sequence is decodable by the decoder, wherein the syntax structure includes a syntax element that indicates a number of sub-profiles, and includes a list of the sub-profiles in a form of a loop with a fixed number of iterations.

2. The method of claim 1, wherein:
    the first indication is coded as an octet string of at least three octets in length; and
    the first indication is a sub-profile of the second indication.

3. The method of claim 1, wherein a media bitstream conforms to both of the first sub-profile and the second sub-profile.

4. The method of claim 1, further comprising:
    determining that the coded video sequence is decodable by the decoder; and
    wherein selectively decoding the coded video sequence comprises:
    decoding the coded video sequence based on the determining that the coded video sequence is decodable by the decoder.

5. A device for media decoding, comprising:
    at least one memory configured to store program code; and
    at least one processor configured to read the program code and operate as instructed by the program code, the program code including:
        decoding code configured to cause the at least one processor to:
            decode, from a syntax structure, a first indication, said first indication being an ITU-T Rec. T.35 string, indicative of a first sub-profile that identifies a first defined set of tools capable of being used by an encoder to encode a video sequence to generate a coded video sequence that conforms to the first sub-profile and capable of being used by a decoder to decode the coded video sequence; and
            decode, from the syntax structure, a second indication, said second indication being an ITU-T Rec. T.35 string, indicative of a second sub-profile that identifies a second defined set of tools capable of being used by the encoder to encode the video sequence to generate the coded video sequence that conforms to the second sub-profile and capable of being used by the decoder to decode the coded video sequence that conforms to the second sub-profile;
        combining code configured to cause the at least one processor to combine the first indication indicative of the first sub-profile that identifies the first defined set of tools capable of being used by the encoder to encode the video sequence to generate the coded video sequence that conforms to the first sub-profile and capable of being used by the decoder to decode the coded video sequence that conforms to the first sub-profile and the second indication indicative of the second sub-profile that identifies the second defined set of tools capable of being used by the encoder to encode the video sequence to generate the coded video sequence that conforms to the second sub-profile and capable of being used by the decoder to decode the coded video sequence that conforms to the second sub-profile;
        identifying code configured to cause the at least one processor to identify a combined conformance point based on combining the first indication and the second indication;

comparing code configured to cause the at least one processor to compare the combined conformance point and capability information of the decoder;

determining code configured to cause the at least one processor to determine whether the coded video sequence is decodable by the device based on comparing the combined conformance point and the capability information of the decoder; and selectively decoding code configured to cause the at least one processor to selectively decode the coded video sequence based on determining whether the coded video sequence is decodable by the device, wherein the syntax structure includes a syntax element that indicates a number of sub-profiles, and includes a list of the sub-profiles in a form of a loop with a fixed number of iterations.

6. The device of claim 5, wherein:

the first indication is coded as an octet string of at least three octets in length; and the first indication is a sub-profile of the second indication.

7. The device of claim 5, wherein a media bitstream conforms to both of the first sub-profile and the second sub-profile.

8. A non-transitory computer-readable medium storing instructions, the instructions comprising:

one or more instructions that, when executed by one or more processors of a device, cause the one or more processors to:

decode, from a syntax structure, a first indication, said first indication being an ITU-T Rec. T.35 string, indicative of a first sub-profile that identifies a first defined set of tools capable of being used by an encoder to encode a video sequence to generate a coded video sequence that conforms to the first sub-profile and capable of being used by a decoder to decode the coded video sequence that conforms to the first sub-profile;

decode, from the syntax structure, a second indication, said second indication being an ITU-T Rec. T.35 string, indicative of a second sub-profile that identifies a second defined set of tools capable of being used by the encoder to encode the video sequence to generate the coded video sequence that conforms to the second sub-profile and capable of being used by the decoder to decode the coded video sequence that conforms to the second sub-profile;

combine the first indication indicative of the first sub-profile that identifies the first defined set of tools capable of being used by the encoder to encode the video sequence to generate the coded video sequence that conforms to the first sub-profile and capable of being used by the decoder to decode the coded video sequence that conforms to the first sub-profile and the second indication indicative of the second sub-profile that identifies the second defined set of tools capable of being used by the encoder to encode the video sequence to generate the coded video sequence that conforms to the second sub-profile and capable of being used by the decoder to decode the coded video sequence that conforms to the second sub-profile;

identify a combined conformance point based on combining the first indication and the second indication;

compare the combined conformance point and capability information of the decoder;

determine whether the coded video sequence is decodable by the device based on comparing the combined conformance point and the capability information of the decoder; and selectively decode the coded video sequence based on determining whether the coded video sequence is decodable by the device, wherein the syntax structure includes a syntax element that indicates a number of sub-profiles, and includes a list of the sub-profiles in a form of a loop with a fixed number of iterations.

* * * * *